(12) United States Patent
Johnson (10) Patent No.: US 8,878,073 B2
(45) Date of Patent: Nov. 4, 2014

(54) PRINTED CIRCUIT BOARD AND METHODS OF MANUFACTURING THE SAME

(75) Inventor: Philip W. Johnson, Bluffton, IN (US)

(73) Assignee: Regal Beloit America, Inc., Beloit, WI (US)

( * ) Notice: Subject to any disclaimer, the term of this patent is extended or adjusted under 35 U.S.C. 154(b) by 324 days.

(21) Appl. No.: 13/526,186

(22) Filed: Jun. 18, 2012

(65) Prior Publication Data
US 2013/0333932 A1 Dec. 19, 2013

(51) Int. Cl.
H05K 1/16 (2006.01)
H05K 3/30 (2006.01)
H05K 1/11 (2006.01)

(52) U.S. Cl.
USPC .............................. 174/260; 174/262; 29/832

(58) Field of Classification Search
CPC ... H05K 1/0256; H05K 1/181; H05K 1/0262; H05K 2201/10121; H05K 2201/09063; H05K 2201/10166
USPC ............ 174/250, 255, 260, 262–266; 29/832, 29/865–867; 361/760
See application file for complete search history.

(56) References Cited

U.S. PATENT DOCUMENTS

| | | | |
|---|---|---|---|
| 4,343,084 A * | 8/1982 | Wilmarth | 29/843 |
| 6,448,506 B1 * | 9/2002 | Glenn et al. | 174/260 |
| 7,724,115 B2 * | 5/2010 | Chen et al. | 336/198 |
| 8,097,868 B2 | 1/2012 | Monaco et al. | |
| 2001/0033015 A1 * | 10/2001 | Corisis | 257/691 |
| 2002/0003295 A1 * | 1/2002 | Kahlisch et al. | 257/691 |

OTHER PUBLICATIONS

Optimum Design Staff, "Clearance and Creepage in PCB Design," retrieved from website http://designinthetrenches.com/?p=1 on Jun. 18, 2012.

* cited by examiner

Primary Examiner — Hoa C Nguyen
(74) Attorney, Agent, or Firm — Armstrong Teasdale LLP (57) ABSTRACT

A printed circuit board is provided. The printed circuit board includes a base having a top and a bottom. The top has a first circuit area, a second circuit area and a slotted area disposed between the first circuit area and the second circuit area. The slotted area includes a first row of a plurality of first slots, each first slot of the plurality of first slots has a first length and is separated from an adjacent first slot by a first space. The slotted area includes a second row of a plurality of second slots that is positioned parallel with respect to the first row. Each second slot of the plurality of second slots has a second length that is different than the first length and is separated from an adjacent second slot by a second space. The second space includes a different length than the first space.

20 Claims, 6 Drawing Sheets

PRINTED CIRCUIT BOARD AND METHODS OF MANUFACTURING THE SAME

BACKGROUND OF THE INVENTION

The embodiments described herein relate generally to a printed circuit board, and more particularly, to methods and systems used to increase distances for creepage paths for electrical components coupled to the printed circuit board.

Electrical systems and signal transmission lines can be subjected to voltage surges induced by factors such as lightning, multiple pulses and/or disturbances in power supply. In some known electrical systems, electrical components, such as optocouplers, can provide electrical isolation in response to hazardous voltages. Optocouplers can block high voltages to prevent a voltage surge in one part of the electrical system from disrupting and/or destroying other parts of the electrical system. More particularly, an optocoupler can connect input and output sides of an electrical circuit by a light transmission that is modulated by input current. Conventional optocouplers are configured to transfer useful input signals on an emitter side, transmit the signal across a dielectric insulation and detect the signal on an output side.

Typically, optocouplers are coupled to printed circuit boards. When the optocoupler is coupled to the printed circuit board, the shortest path between two conductive parts of the optocoupler, measured along the surface of the insulation, is known as the "creepage" path. Industry standards for printed circuit boards can stipulate minimum distances for creepage paths for safety reasons. Designs for printed circuit boards, however, can be driven to reduce size and increase component density on circuit boards to facilitate miniaturization and reduced costs which can lead to decreased creepage distances. Some printed circuit boards may include slots disposed between the input and output sides of the optocoupler to facilitate increasing the creepage distance. Conventional slots, however, can weaken the printed circuit board leading to flexing and/or cracking of the printed circuit board. Moreover, weakened printed circuit boards can further compromise solder joints of electrical components which can lead to increased body stress for the electrical components.

BRIEF DESCRIPTION OF THE INVENTION

In one aspect, a printed circuit board is provided. The printed circuit board includes a base that has a top and a bottom. The top has a first circuit area, a second circuit area and a slotted area disposed between the first circuit area and the second circuit area. The slotted area includes a first row of a plurality of first slots, wherein each first slot of the plurality of first slots has a first length and is separated from an adjacent first slot by a first space. The slotted area further includes a second row of a plurality of second slots that is positioned parallel with respect to the first row. Each second slot of the plurality of second slots has a second length that is different than the first length and is separated from an adjacent second slot by a second space. The second space includes a different length than the first space.

In another aspect, an electrical device is provided. The electrical device includes a base that has a top and a bottom. The top has a first circuit area, a second circuit area and a slotted area disposed between the first circuit area and the second circuit area. The slotted area includes a first row of a plurality of first slots, wherein each first slot of the plurality of first slots has a first length and is separated from an adjacent first slot by a first space. The slotted area further includes a second row of a plurality of second slots that is positioned parallel with respect to the first row. Each second slot of the plurality of second slots has a second length that is different than the first length and separated from an adjacent second slot by a second space. The second space includes a different length than the first space. The electrical device further includes an electrical component coupled to the top and extending across the first row of the plurality of the first slots and the second row of the plurality of the second slots to facilitate increasing a creepage path of the electrical component.

In yet another aspect, a method of manufacturing an electrical device having a printed circuit board that includes a first circuit area, a second circuit area and a slotted area is provided. The method includes forming a first row of a plurality of first slots through the slotted area; forming a second row of a plurality of second slots through the slotted area; and coupling an electrical component to the first circuit area, the second circuit area and across the first row and the second row.

DETAILED DESCRIPTION OF THE INVENTION

The embodiments described herein relate to printed circuit boards and methods of manufacturing the printed circuit boards. More particularly, the embodiments relate to a printed circuit board that is configured to increase creepage distance to facilitate isolating voltage surges experienced by electrical components coupled to the printed circuit board. It should be understood that the embodiments described herein for electrical components are not limited to optocouplers, and further understood that the descriptions and figures that utilize an optocoupler are exemplary only and the embodiments described herein are compatible with existing circuit boards and/or new circuit boards.

Figure 1:
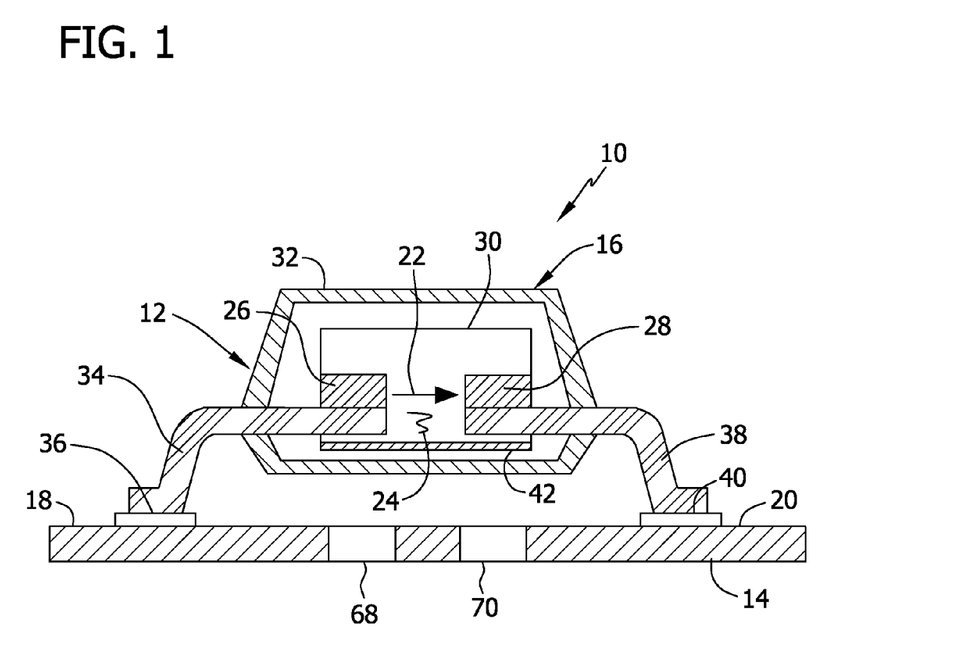
FIG. 1 illustrates a cross-sectional view of an electrical device having an electrical component coupled to an exemplary printed circuit board.
Figure 2:
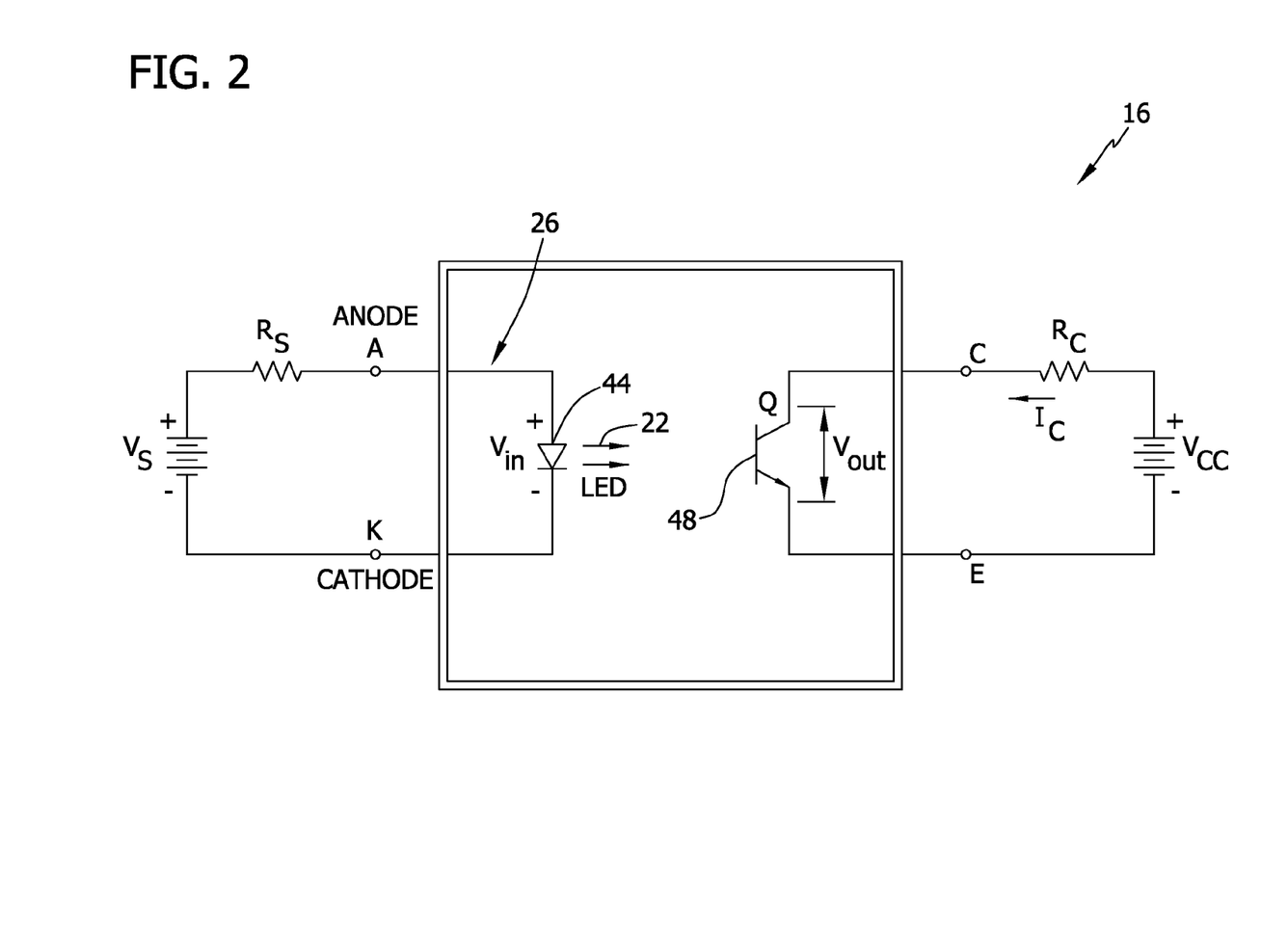
FIG. 2 illustrates a schematic view of the electrical component shown in FIG. 1.

FIG. 1 illustrates a cross-sectional view of an electrical device 10 that includes an electrical component 12 coupled to a printed circuit board 14. FIG. 2 illustrates a schematic view of the electrical component 12 shown in FIG. 1. In the exemplary embodiment, electrical component 12 includes an optocoupler 16 which is configured to allow different sections 18, 20 of printed circuit board 14 to exchange a command and/or information signal 22 in a bi-directional way while different sections 18, 20 remain electrically separated and/or isolated from each other. For safety reasons, optocoupler 16 provides an interface 24 between sections 18, 20 which operate at different voltage levels. Optocoupler 16 may be used as a signal converter between high voltage devices (not shown) and low voltage solid state logic circuits (not shown). Alternatively, optocouplers 16 can be utilized in any situation where signal 22 must be passed between sections 18, 20 which remain electrically isolated from each other.

Optocoupler 16 includes an emitter 26 and a detector 28, which are coupled together by a galvanic insulator 30. Optocoupler 16 further includes a housing 32 that is configured to encapsulate emitter 26, detector 28 and insulator 30. Moreover, optocoupler 16 includes a first conductive pin 34 that is coupled to a first connector pad 36 of printed circuit board 14 and a second conductive pin 38 that is coupled to a second connector pad 40 of printed circuit board 14. A creepage path 42 of optocoupler 16 includes the shortest distance between conductive pins 34, 38 along insulator 30.

In the exemplary embodiment, emitter 26 includes an optical source 44 such as, but not limited to, a light emission diode. Alternatively, emitter 26 may include any source that is configured to convert electrical signal 22 into a light pulse. Detector 28 includes a receiving source 48 such as, but not limited to, a photo diode and photo transistor. Signal 22 that is emitted from emitter 26 impinges on the detector 28 which is configured to set up a reverse current. Alternatively, detector 28 may include any source that is configured to receive signals 22 transmitted by emitter 26 and convert light pulse 46 into electrical signals.

Figure 3:
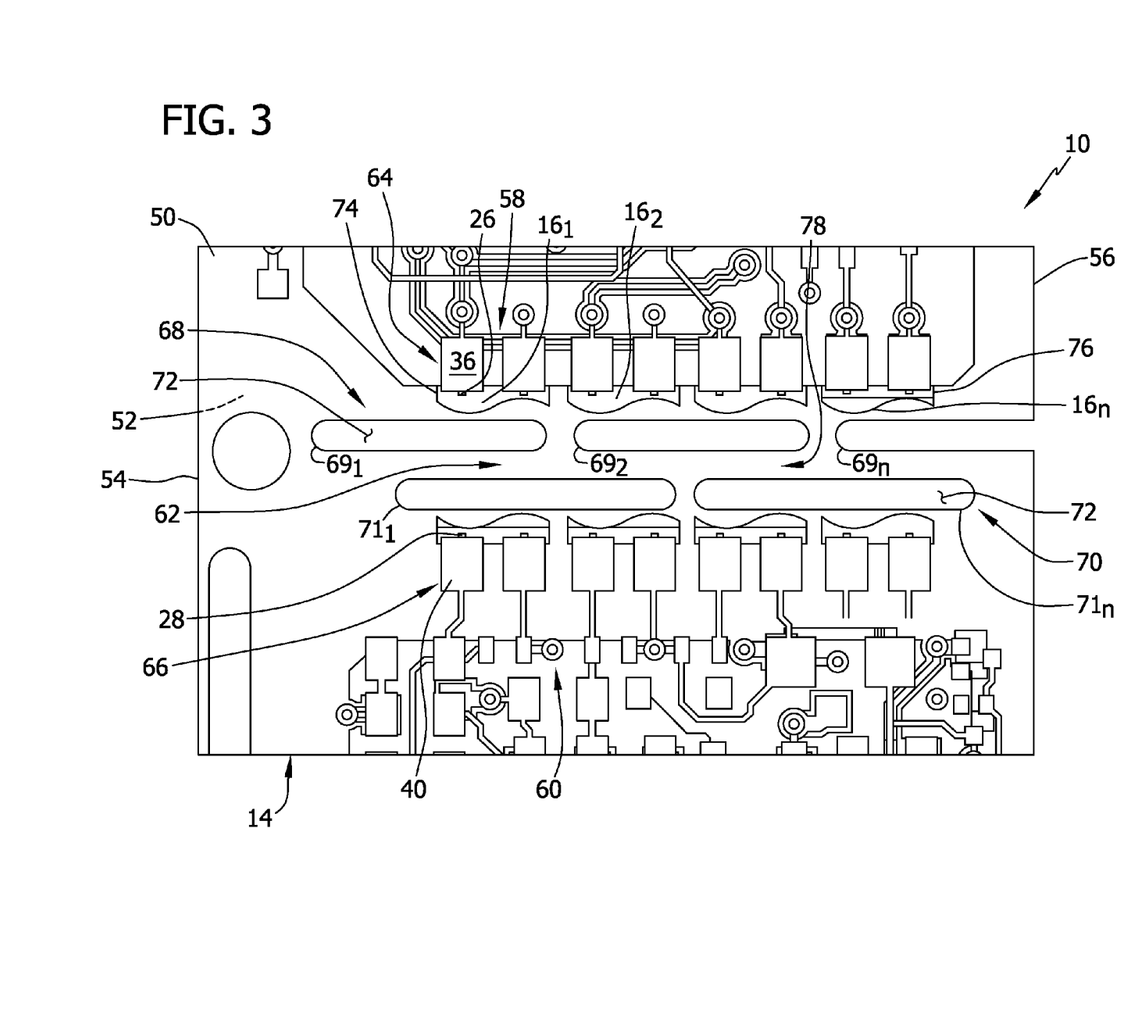
FIG. 3 illustrates a top view of the electrical device shown in FIG. 1 and showing a plurality of electrical components coupled to the printed circuit board.

FIG. 3 illustrates a top view of electrical device 10 shown in FIG. 1 and illustrates a plurality of optocouplers 16 coupled to printed circuit board 14. Printed circuit board 14 includes a top 50, a bottom 52, a first sidewall 54 and a second sidewall 56 which are coupled to top 50 and bottom 52. Top 50 includes a first circuit area 58, a second circuit area 60 and a slotted area 62 that is disposed between first circuit area 58 and second circuit area 60. First circuit area 58 includes a first row 64 of connector pads 36 and second circuit area 60 includes a second row 66 of connector pads 40. First circuit area 58 and second circuit area 60 are configured to couple to optocouplers 16. Slotted area 62 is configured to facilitate increasing distances for creepage paths 42 (shown in FIG. 1) for each optocoupler 16 while providing structure and rigidity to printed circuit board 14.

Slotted area 62 includes a first row 68 of a plurality of first slots $69_1 \ldots _n$ and a second row 70 of a plurality of second slots $71_1 \ldots _n$. In the exemplary embodiment, each first slot 69 and second slot 71 is configured to extend through top 50 and bottom 52. First slots 69 and second slots 71 are configured to form a creepage barrier 72 within slotted area 62. More particularly, creepage barrier 72 is configured to position an air space which facilitates preventing creepage paths 42 (shown in FIG. 1) from extending across first and second slots 69 and 71 and facilitates directing creepage paths 42 to extend about first and second slots 69 and 71 as described herein.

Optocouplers 16 are coupled to first circuit area 58 and second circuit area 60 and are configured to extend across first row 68 of the plurality of first slots 69 and second row 70 of the plurality of second slots 71. In FIG. 3, portions of optocouplers 16 are removed for illustration purposes to show slots 69 and slots 71. More particularly, optocoupler emitter 26 is coupled to first connector pad 36 and between first circuit area 58 and first row 68 of the plurality of first slots 69. Moreover, optocoupler detector 28 is coupled to second connector pad 40 and between second circuit area 60 and second row 70 of the plurality of second slots 71. Insulator 30 (shown in FIG. 1) is configured to extend across first row 68 and second row 70.

In the exemplary embodiment, first slot $69_1$ is configured to extend toward first sidewall 54 and beyond a first side 74 of optocoupler $16_1$ and first slot $69_n$ is configured to extend toward second sidewall 56 and beyond a second side 76 of optocoupler $16_n$. Second slot $71_1$ is configured to extend toward first sidewall 54 and beyond first side 74 of optocoupler $16_1$ and second slot $71_n$ is configured to extend toward second sidewall 56 and beyond second side 76 of optocoupler $16_n$.

In the exemplary embodiment, first row 68 includes three first slots 69 and second row 70 includes three second slots 71. Alternatively, first row 68 may include more than or less than three first slots 69 and second row 70 may include more than or less than three second slots 71. Any number of slots 69, 71 may be used that enables electrical device 10 to function as described herein. The shapes, sizes and orientations of first row 68 of the plurality of first slots 69 and second row 70 of the plurality of second slots 71 facilitate increasing distances for creepage path 42 (shown in FIG. 1) and increasing stiffness/rigidity of printed circuit board 14 as described herein.

Figure 4:
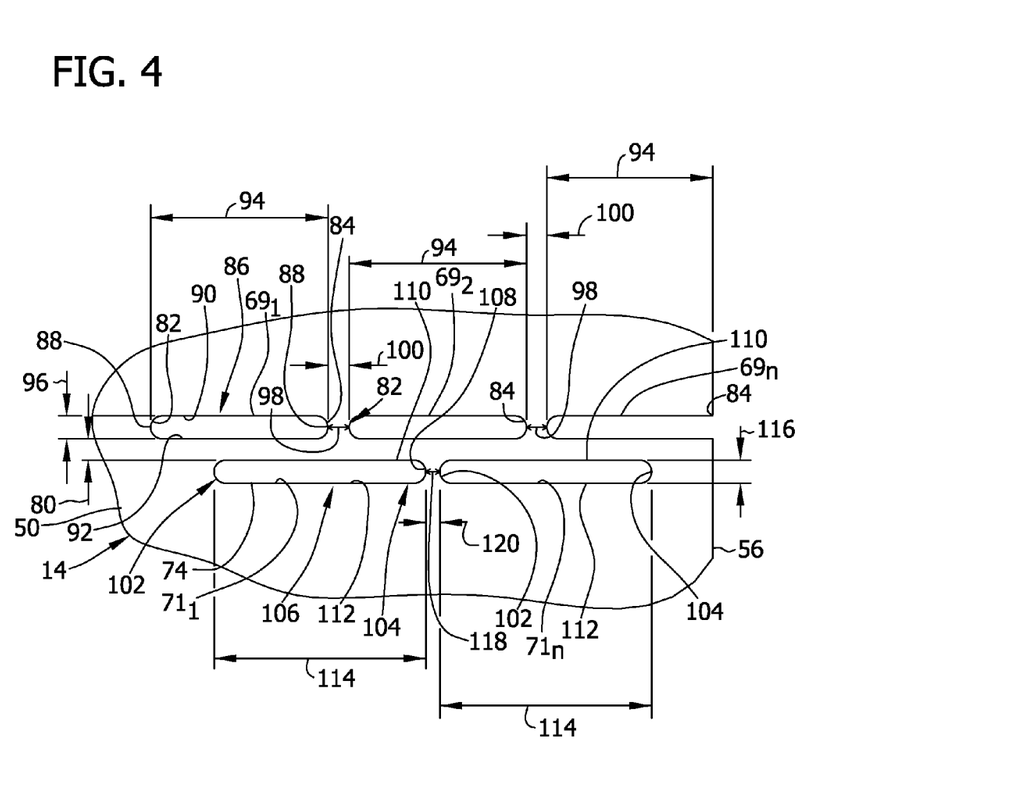
FIG. 4 illustrates a top view of an exemplary plurality of slots disposed through the printed circuit board shown in FIG. 3.

FIG. 4 illustrates a top view of exemplary slots 69, 71 disposed through slotted area 62 of printed circuit board 14. In the exemplary embodiment, second row 70 of the plurality of second slots 71 is disposed within slotted area 62 and parallel to first row 68 of the plurality of first slots 69. Moreover, second row 70 is disposed within slotted area 62 in a staggered orientation 78 with respect to first row 68. Alternatively, second row 70 can be disposed within slotted area 62 in any orientation and with respect to first row 68 to enable electrical device 10 to function as described herein. Second row 70 is separated from first row 68 at a length 80 in a range between about 0.01 inches and about 0.1 inches. More particularly, length 80 has a linear dimension of about 0.05 inches. Alternatively, length 80 can have any size that enables electrical device 10 to function as described herein.

Each first slot 69 includes a first portion 82, a second portion 84 and a third portion 86 disposed between first portion 82 and second portion 84. In the exemplary embodiment, first portion 82 and second portion 84 include curvilinear ends 88 and third portion 86 includes a first side 90 and a second side 92 to facilitate forming an elliptical shape for first slot 69. Alternatively, first, second and third portions 82, 84 and 86 may include other configurations to form first slot 69 into other shapes such as, but not limited to, arcuate, wave, spiral, square and circular shapes. First, second and third portions 82, 84 and 86 may include any configuration that enables electrical device 10 to function as described herein. In the exemplary embodiment, second portion 84 of first slot $69_n$ is configured to intersect second sidewall 56. More particularly, second portion 84 of first slot $69_n$ is configured to open into second sidewall 56.

First slot 69 includes a first length 94 as measured between first portion 82 and second portion 84. In the exemplary embodiment, first length 94 has a linear dimension in a range between about 0.01 inches and about 1 inch. More particularly, first length 94 has a linear dimension of about 0.375 inches. Alternatively, first length 94 can be any size to enable electrical device 10 to function as described herein. First slot 69 includes a first width 96 as measured between first side 90 and second side 92. In the exemplary embodiment, first width 96 has a linear dimension in a range between about 0.01 inches and about 0.1 inches. More particularly, first width 96 has a linear dimension of about 0.05 inches. Alternatively, first width 96 can be any size to enable electrical device 10 to function as described herein.

Slotted area 62 further includes a plurality of first spaces $98_1 \ldots _n$. Each first space 98 is disposed between a pair of adjacent first slots 69. For example, first space $98_1$ is disposed between first slot $69_1$ and first slot $69_2$. Each first space 98 has a length 100 that is measured between adjacent first slots 69. More particularly, length 100 is measured between second portion 84 of first slot 69$_1$ and first portion 82 of first slot 69$_2$. In the exemplary embodiment, length 100 has a linear dimension in a range between about 0.01 inches and about 0.01 inches. More particularly, length 100 has a linear dimension of about 0.5 inches. Alternatively, length 100 can be any size that enables electrical device 10 to function as described herein.

In the exemplary embodiment, each second slot 71 includes a first portion 102, a second portion 104 and a third portion 106 disposed between first portion 102 and second portion 104. In the exemplary embodiment, first portion 102 and second portion 104 include curvilinear ends 108 and third portion 106 includes a first side 110 and a second side 112 to facilitate forming an elliptical shape. Alternatively, first, second and third portions 102, 104 and 106 may include other configurations to form second slot 71 into other shapes such as, but not limited to, arcuate, wave, spiral, square and circular shapes. First, second and third portions 102, 104 and 106 may include any configuration that enables electrical device 10 to function as described herein.

Second slot 71 includes a second length 114 as measured between first portion 102 and second portion 104. In the exemplary embodiment, second length 114 is different than first length 94. More particularly, second length 114 is longer than first length 94. Alternatively, second length 114 can be about the same length or a shorter length as first length 94. Second length 114 has a linear dimension in a range of about 0.01 inches and about 1 inch. More particularly, second length 114 has a linear dimension of about 0.45 inches. Alternatively, second length 114 can be any size to enable electrical device 10 to function as described herein.

Second slot 71 includes a second width 116 as measured between first side 110 and second side 112. In the exemplary embodiment, second width 116 has a linear dimension in a range between about 0.01 inches and about 0.1 inches. More particularly, second width 116 has a linear dimension of about 0.05 inches. Alternatively, second width 116 can be any size that enables electrical device 10 to function as described herein.

Slotted area 62 further includes a plurality of second spaces 118$_{1...n}$. Each second space 118 is disposed between a pair of adjacent second slots 71. For example, second space 118$_1$ is disposed between second slot 71 and second slot 71$_2$. In the exemplary embodiment, second space 118 is shorter than first space 98. Alternatively, second space 118 can have about the same length or longer length than first space 98. Each second space 118 has a length 120 that is measured between adjacent second slots 71. More particularly, length 120 is measured between second portion 104 of second slot 71$_1$ and first portion 102 of second slot 71$_n$. In the exemplary embodiment, length 120 has a linear dimension in a range between 0.01 inches and about 0.1 inches. More particularly, each length 120 has a linear dimension of about 0.03 inches. Alternatively, length 120 can be any size that enables printed circuit board 14 to function as described herein.

Figure 5:
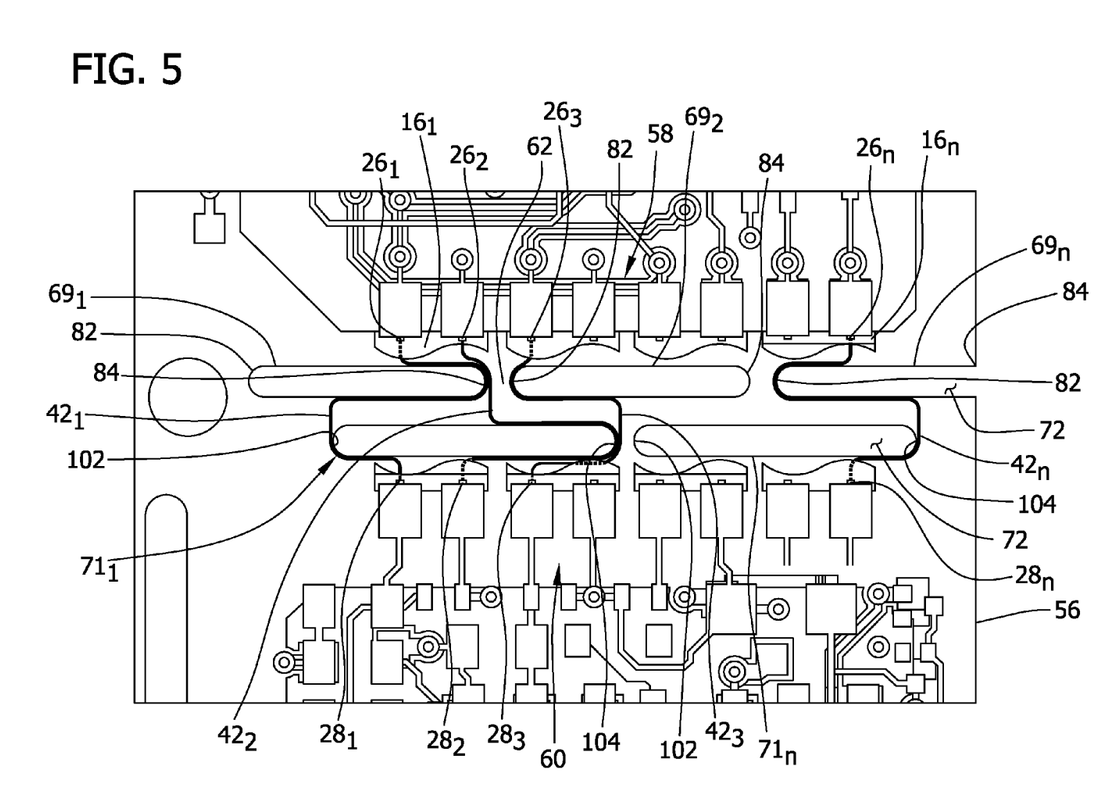
FIG. 5 illustrates a top view of a plurality of electrical components shown in FIG. 3 and a plurality of creepage paths associated with the electrical components.

FIG. 5 illustrates a top view of the plurality of optocouplers 16$_{1...n}$ and a plurality of creepage paths 42$_{1...n}$ associated with optocouplers 16$_{1...n}$. Each creepage path 42 is configured to extend from emitter 26, across slotted area 62 and toward detector 28. Creepage paths 42 are configured to extend along a shortest distance between emitter 26 and detector 28. Since first row 68 and second row 70 are configured to prevent creepage paths 42 extending across creepage barriers 72 of first slots 69 and second slots 71, creepage paths 42 are configured to extend along first row 68 of the plurality of first slots 69 and along second row 70 of the plurality of second slots 71. More particularly, creepage path 42 is configured to extend partially along one first slot 69 of the plurality of first slots 69 and extend partially along one second slot 71 of the plurality of second slots 71.

As an illustrative example, creepage path 42$_1$ is configured to extend from emitter 26$_1$ and along second portion 84 of first slot 69$_1$. Creepage path 42$_1$ is configured to extend from second portion 84, across slotted area 62 and along first portion 102 of second slot 71$_1$. Creepage path 42$_1$ is configured to extend from first portion 102 of second slot 71$_1$ and toward detector 28$_1$.

In another illustrative example, creepage path 42$_2$ is configured to extend from emitter 26$_2$ and along second portion 84 of first slot 69$_1$. Creepage path 42$_2$ is configured to extend from second portion 84, across slotted area 62 and along second portion 104 of second slot 71$_1$. Moreover, creepage path 42$_2$ is configured to extend from second portion 104 of second slot 71$_1$ and toward detector 28$_2$.

Still further, in another illustrative example, creepage path 42$_3$ is configured to extend from emitter 26$_3$ and along first portion 82 of first slot 69$_2$. Creepage path 42$_3$ is configured to extend from first portion 82, across slotted area 62 and along second portion 104 of second slot 71$_1$. Moreover, creepage path 42$_3$ is configured to extend from second portion 104 of second slot 71$_1$ and toward detector 28$_3$.

Since second portion 84 of first slot 69$_n$ is configured to open into second sidewall 56, first slot 69$_n$ is configured to facilitate positioning creepage barrier 72 near second sidewall 56. Creepage path 42$_n$ is configured to extend from emitter 26$_n$ and along first portion 82 of first slot 69$_n$. Creepage path 42$_n$ is configured to extend across slotted area 62 and along second portion 104 of second slot 71$_n$. Moreover, creepage path 42$_n$ is configured to extend from second portion 1084 of second slot 71$_n$ and toward detector 28$_n$.

The sizes, shapes and orientations of first row 68 of the plurality of first slots 69 and second row 70 of the plurality of second slots 71 within printed circuit board 14 facilitate increasing distances for creepage paths 42 as compared to conventional circuit boards (not shown). Further, because of the staggered orientation 78 of second row 70 with respect to first row 68, distances for creepage paths 42 are increased about first row 68 and second row 70 as compared to conventional circuit boards (not shown). More particularly, the sizes, shapes and orientations of first slots 69 and second slots 71 facilitate providing creepage barriers 72 which facilitate creepage paths 42 to extend along, about and/or adjacent to first slots 69 and second slots 71. Moreover, the sizes, shapes and orientations of first row 68 and second row 70 facilitate increasing the stiffness/rigidity of printed circuit board 14 while minimizing and/or eliminating flexing and/or breaking of optocouplers 16. Creepage path 42 facilitates increasing electrical isolation of second circuit area 60 from first circuit area 58 as compared to conventional printed circuit board 14$s$ (not shown). Moreover, increased creepage paths 42 facilitate enhancing electrical protection from voltage surges (not shown) transmitting from first circuit area 58 to second circuit area 60.

Figure 6:
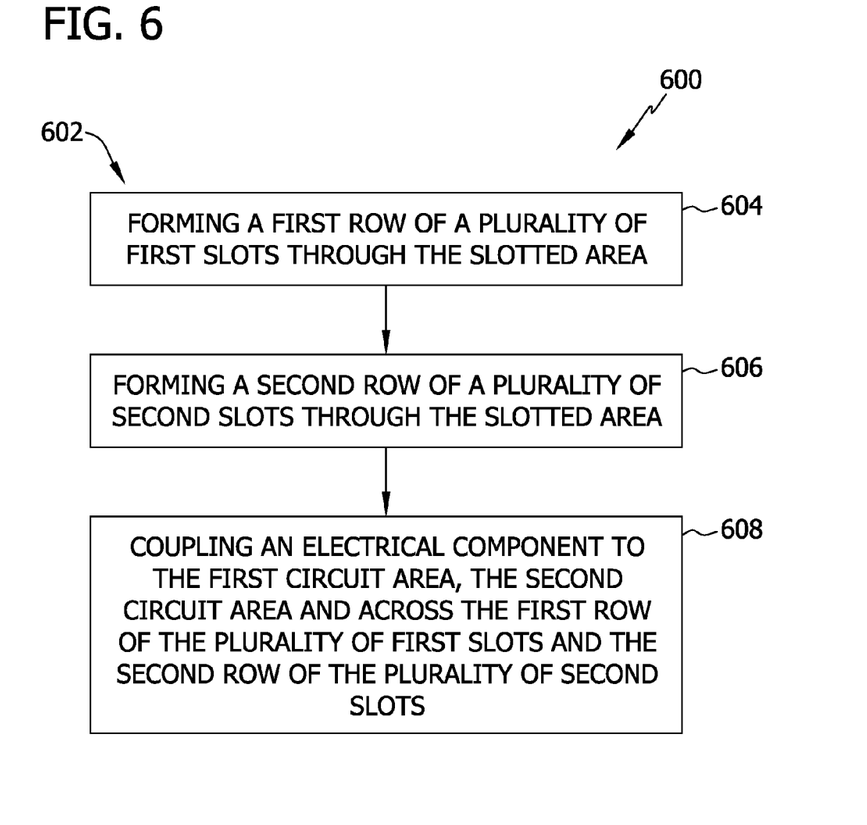
FIG. 6 illustrates an exemplary flowchart illustrating a method of manufacturing an electrical device.

FIG. 6 illustrates an exemplary flowchart 600 illustrating a method 602 of manufacturing an electrical device, for example electrical device 10 (shown in FIG. 1), having a printed circuit board, such as printed circuit board 14 (shown in FIG. 3). The printed circuit board includes a first circuit area, a second circuit area and a slotted area such as, for example, first circuit area 58, second circuit area 60 and slotted area 62 (shown in FIG. 3). Method 602 includes forming 604 a first row, for example first row 68 (shown in FIG. 3), of a plurality of first slots such as first slots 69 (shown in FIG. 3), through the slotted area. Additionally, method 602 includes forming 606 a second row, for example second row 70 (shown in FIG. 3), of a plurality of second slots such as second slots 71 (shown in FIG. 3) through the slotted area. In one embodiment, forming the first row and second row includes processes such as, but not limited to, cutting and/or boring the plurality of first slots and the plurality of second slots through a top and bottom, for example top 50 and bottom 52 (shown in FIG. 3) of printed circuit board. Moreover, method 602 includes forming each first slot to have a different length than each second slot. Method 602 includes forming the second row 70 of the plurality of second slots in a staggered orientation within the slotted area and with respect to the first row of the plurality of first slots.

Method 602 further includes coupling 608 an electrical component, for example electrical component 12 (shown in FIG. 1) to the first circuit area, the second circuit area and across the first row of the plurality of first slots and the second row of the plurality of second slots. In one embodiment, method 602 includes coupling an emitter, for example emitter 26 (shown in FIG. 1), between the first circuit area and the first row of the plurality of first slots. Moreover, method 602 includes coupling a detector of the electrical component, for example detector 28 (shown in FIG. 1), between the second circuit area and the second row of the plurality of second slots.

A technical effect of the systems and methods described herein includes at least one of: a printed circuit board having a first row of a plurality of first slots and a second row of a plurality of second slots that is positioned parallel with respect to said first row of said plurality of said first slots; an electrical device having an electrical component extending across the first row of the plurality of the first slots and the second row of the plurality of the second slots to facilitate increasing a creepage path of the electrical component; and a method of manufacturing an electrical device by coupling the electrical component to extend across the first row of the plurality of the first slots and the second row of the plurality of the second slots to facilitate increasing a creepage path of the electrical component.

Exemplary embodiments of a printed circuit board and methods for manufacturing printed circuit boards are described above in detail. The size ranges disclosed herein include all the sub-ranges therebetween. The methods and systems are not limited to the specific embodiments described herein, but rather, components of systems and/or steps of the methods may be utilized independently and separately from other components and/or steps described herein. For example, the methods may also be used in combination with other manufacturing systems and methods, and are not limited to practice with only the systems and methods as described herein. Rather, the exemplary embodiment can be implemented and utilized in connection with many other electrical component applications.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A printed circuit board comprising:
    a base comprising a top and a bottom, said top having a first circuit area, a second circuit area and a slotted area disposed between said first circuit area and said second circuit area, said slotted area comprising:
        a first row of a plurality of first slots, each said first slot of said plurality of first slots having a first length and being separated from an adjacent said first slot by a first space; and
        a second row of a plurality of second slots that is positioned parallel with respect to said first row, each said second slot of said plurality of second slots having a second length that is different than said first length and is separated from an adjacent said second slot by a second space, said second space having a different length than said first space.

2. The printed circuit board of claim 1, wherein said second row is disposed in a staggered orientation within slotted area and with respect to said first row.

3. The printed circuit board of claim 1, wherein said second length is longer than said first length.

4. The printed circuit board of claim 1, wherein said second space is shorter than said first space.

5. The printed circuit board of claim 1, wherein said base includes a sidewall disposed between said top and said bottom, one of said first slots is configured to couple to said sidewall.

6. The printed circuit board of claim 1, wherein said first length and said second length have a linear dimension in a range between about 0.01 inches and about one inch.

7. The printed circuit board of claim 1, wherein said first length has a linear dimension of about 0.375 inches.

8. The printed circuit board of claim 1, wherein said second length has a linear dimension of about 0.45 inches.

9. The printed circuit board of claim 1, wherein said first space and said second space have a linear dimension in a range between about 0.01 inches and about 0.1 inches.

10. The printed circuit board of claim 1, wherein said first space has a linear dimension of about 0.05 inches and said second space has a linear dimension of about 0.03 inches.

11. An electrical device comprising:
    a base comprising a top and a bottom, said top having a first circuit area, a second circuit area and a slotted area disposed between said first circuit area and said second circuit area, said slotted area comprising:
    a first row of a plurality of first slots, each said first slot of said plurality of first slots having a first length and being separated from an adjacent said first slot by a first space; and
    a second row of a plurality of second slots that is positioned parallel with respect to said first row, each said second slot of said plurality of second slots having a second length that is different than said first length and is separated from an adjacent said second slot by a second space, said second space having a different length than said first space; and
    an electrical component coupled to said top and extending across said first row of said plurality of said first slots and said second row of said plurality of said second slots to facilitate increasing a creepage path of said electrical component.

12. The electrical device of claim 11, wherein said electrical component comprises an optocoupler comprising:

an emitter coupled to said top between said first circuit area and said first row; and a detector coupled to said top between said second circuit area and said second.

13. The electrical device of claim 12, wherein said creepage path extends along a shortest distance between said emitter and said detector and along said first row of said plurality of said first slots and along said second row of said plurality of said second slots.

14. The electrical device of claim 11, wherein said creepage path extends partially along a first slot of said plurality of first slots and partially along a second slot of said plurality of second slots.

15. The electrical device of claim 11, wherein a first slot of said plurality of slots includes a first portion and a second portion and a second slot of said plurality of second slot includes a first portion and a second portion, said creepage path extends along said first portion of said first slot and along said second portion of said second slot.

16. The electrical device of claim 11, wherein a first slot of said plurality of slots includes a first portion and a second portion and a second slot of said plurality of second slot includes a first portion and a second portion, said creepage path extends along said second portion of said first slot and along said first portion of said second slot.

17. A method of manufacturing an electrical device having a printed circuit board that includes a first circuit area, a second circuit area and a slotted area, said method comprising:

forming a first row of a plurality of first slots through the slotted area;

forming a second row of a plurality of second slots through the slotted area; and coupling an electrical component to the first circuit area, the second circuit area and across the first row and the second row.

18. The method of claim 17, further comprising forming the second row in a staggered orientation within the slotted area and with respect to the first row.

19. The method of claim 17, further comprising forming each said first slot at a different length than each said second slot of the second row.

20. The method of claim 17, further comprising coupling an emitter between the first circuit area and the first row and coupling a detector between the second circuit area and the second row.

* * * * *